United States Patent
Chen et al.

(10) Patent No.: US 10,510,858 B2
(45) Date of Patent: Dec. 17, 2019

(54) METHOD TO IMPROVE HKMG CONTACT RESISTANCE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Lin Chen, Shanghai (CN); Qiang Lei, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/904,175

(22) Filed: Feb. 23, 2018

(65) Prior Publication Data

US 2018/0337247 A1 Nov. 22, 2018

(30) Foreign Application Priority Data

May 19, 2017 (CN) .......................... 2017 1 0355766

(51) Int. Cl.
*H01L 29/49* (2006.01)
*H01L 23/522* (2006.01)
*H01L 21/768* (2006.01)
*H01L 21/28* (2006.01)
*H01L 29/423* (2006.01)
*H01L 23/485* (2006.01)
*H01L 29/78* (2006.01)

(52) U.S. Cl.
CPC .... *H01L 29/4966* (2013.01); *H01L 21/28088* (2013.01); *H01L 21/76802* (2013.01); *H01L 21/76805* (2013.01); *H01L 21/76843* (2013.01); *H01L 23/5226* (2013.01); *H01L 29/42376* (2013.01); *H01L 23/485* (2013.01); *H01L 29/78* (2013.01)

(58) Field of Classification Search
CPC ............... H01L 29/495; H01L 29/4958; H01L 21/28079; H01L 21/28114; H01L 21/76805
See application file for complete search history.

(56) References Cited

U.S. PATENT DOCUMENTS 9,368,603 B2 * 6/2016 Chuang ............. H01L 21/28088

* cited by examiner

*Primary Examiner* — Mark V Prenty
(74) *Attorney, Agent, or Firm* — Kilpatrick Townsend & Stockton LLP

(57) ABSTRACT

A semiconductor device includes a substrate, a gate structure having a metal gate on the substrate, and a contact member extending into the metal gate. The contact member includes a first region on the metal gate and a second region on the first region. The first region has a cross-sectional size larger than a cross-sectional size of the second region. The semiconductor device has a reduced contact resistance between the contact member and the metal gate.

12 Claims, 3 Drawing Sheets

METHOD TO IMPROVE HKMG CONTACT RESISTANCE

CROSS-REFERENCES TO RELATED APPLICATIONS

The present application claims priority to Chinese patent application No. 201710355766.5, filed with the State Intellectual Property Office of People's Republic of China on May 19, 2017, the content of which is incorporated herein by reference in its entirety.

FIELD OF THE INVENTION

The present application relates to semiconductor technology, and more particularly to a semiconductor device and a method for manufacturing the same.

BACKGROUND OF THE INVENTION

As the critical dimension of a semiconductor device continues to shrink, the thickness of a conventional gate dielectric layer including silicon dioxide cannot be reduced by conventional processes. Therefore, a high k (dielectric constant) insulating layer and a metal gate (HKMG) manufacturing process has been proposed.

After forming the metal gate, it is desirable that the contact resistance between a contact member of the metal gate and the metal gate is as small as possible. However, the contact resistance between the contact member and the metal gate of conventional devices is relatively large, and the resistance variations between different conventional devices are also relatively large.

BRIEF SUMMARY OF THE INVENTION

An object of the present disclosure is to reduce a contact resistance between a contact member and a metal gate. Another object of the present disclosure is to reduce the contact resistance variations between a contact member and a metal gate of different semiconductor devices across wafer lots.

According to embodiments of the present disclosure, a semiconductor device includes a substrate, a gate structure having a metal gate on the substrate, and a contact member extending into the metal gate. The contact member includes a first region on the metal gate and a second region on the first region. The first region has a cross-sectional size larger than a cross-sectional size of the second region.

In one embodiment, the gate structure includes a gate dielectric layer on the substrate, a first barrier layer on the gate dielectric layer, a P-type work function layer on the first barrier layer, a second barrier layer on the P-type work function layer, and a metal gate on the second barrier layer.

In one embodiment, the first barrier layer includes a TiN layer on the P-type work function layer, and a TaN layer on the TiN layer.

In one embodiment, the gate structure includes a gate dielectric layer on the substrate, a first barrier layer on the gate dielectric layer, an N-type work function layer on the first barrier layer, a second barrier layer on the N-type work function layer, and a metal gate on the second barrier layer.

In one embodiment, the semiconductor device further includes an adhesive layer between the second barrier layer and the metal gate. In one embodiment, the adhesive layer includes TiAl.

In one embodiment, the first barrier layer includes a TiN layer on the gate dielectric layer, and a TaN layer on the TiN layer.

In one embodiment, the second barrier layer includes a TiN layer.

Embodiments of the present disclosure also provide a method for manufacturing a semiconductor device. The method may include providing a substrate, forming a gate structure on the substrate, the gate structure comprising a metal gate, forming an interlayer dielectric layer on the gate structure, forming a first contact hole extending through the interlayer dielectric layer to expose a surface of the metal gate, and removing a portion of the metal gate using a wet etching process to form a second contact hole having a cross-sectional size larger than a cross-sectional size of the first contact hole.

In one embodiment, the method may further include forming a metal material filling the first contact hole and the second contact hole to form a contact member in electrical contact with the metal gate.

In one embodiment, the wet etching process includes an etchant having an oxidizing agent, a concentrated sulfuric acid, water, a buffer agent, and a cleaning solution.

In one embodiment, the oxidizing agent includes $H_2O_2$, $HNO_2$, $HNO_3$, or $O_3$. The buffer agent includes $CH_3COOH$. The cleaning solution includes a hydrochloric acid or a diluted hydrofluoric acid.

In one embodiment, a ratio of the oxidizing agent and the concentrated sulfuric acid to water and the buffer agent is in a range (1-6):(30-100):(8-20); and the diluted hydrofluoric acid has a concentration in a range between 50 ppm and 200 ppm.

In one embodiment, a ratio of the oxidizing agent and the concentrated sulfuric acid is in a range between 1:1 and 1:6.

In one embodiment, the wet etching process is performed for a time duration in a range between 20 seconds and 120 seconds.

In one embodiment, forming the gate structure includes forming a gate dielectric layer on the substrate, forming a first barrier layer on the gate dielectric layer, forming a work function adjustment layer on the first barrier layer, forming a second barrier layer on the work function adjustment layer, and forming a metal gate on the second barrier layer.

In one embodiment, the method may further include forming an adhesive layer between the second barrier layer and the metal gate. In one embodiment, the adhesive layer includes TiAl.

In one embodiment, the first barrier layer includes a TiN layer on the gate dielectric layer, and a TaN layer on the TiN layer.

In one embodiment, the work function adjustment layer is a P-type work function adjustment layer, and the second barrier layer includes a TiN layer on the P-type work function adjustment layer, and a TaN layer on the TiN layer.

In one embodiment, the work function adjustment layer is an N-type work function adjustment layer, and the second barrier layer includes a TiN layer on the N-type work function adjustment layer.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1:
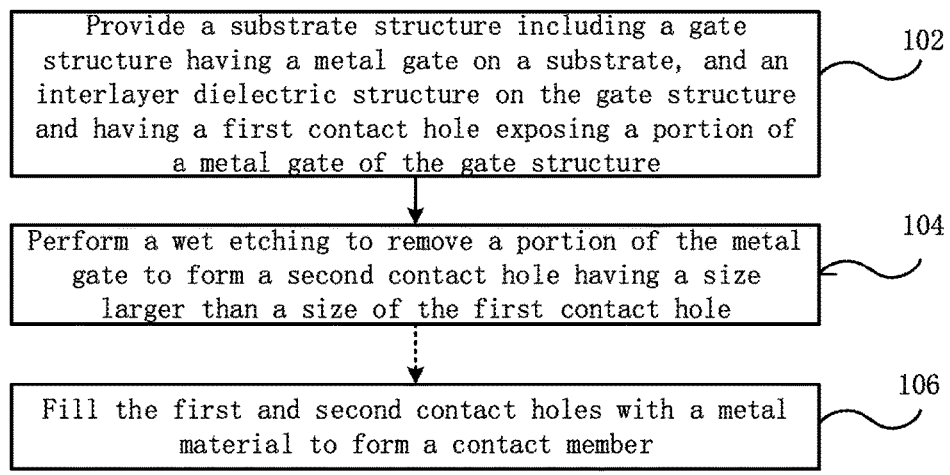
FIG. 1 is a simplified flowchart of a method for manufacturing a semiconductor device according to one embodiment of the present disclosure.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present inventors have intensively studied the above-described problems and discovered that conventional processes utilize a dry etching to etch the interlayer dielectric layer to form a contact hole extending to a surface of a metal gate or into the metal gate. The contact hole is then filled with a metal material to form a contact member. The contact member thus formed has a relatively large resistance that is undesirable.

In addition, for different devices, contact holes formed by dry etching processes may extend to different depths of the metal gate, so that the contact surface area of subsequently formed contact members with the remaining portion of the metal gate will vary, thereby providing a relatively large variation of the contact resistance values. The present inventors propose the following technical solutions.

Embodiments of the present disclosure now will be described more fully hereinafter with reference to the accompanying drawings, in which embodiments of the invention are shown. This disclosure may, however, be embodied in many different forms and should not be construed as limited to the embodiments set forth herein.

Figure 2A:
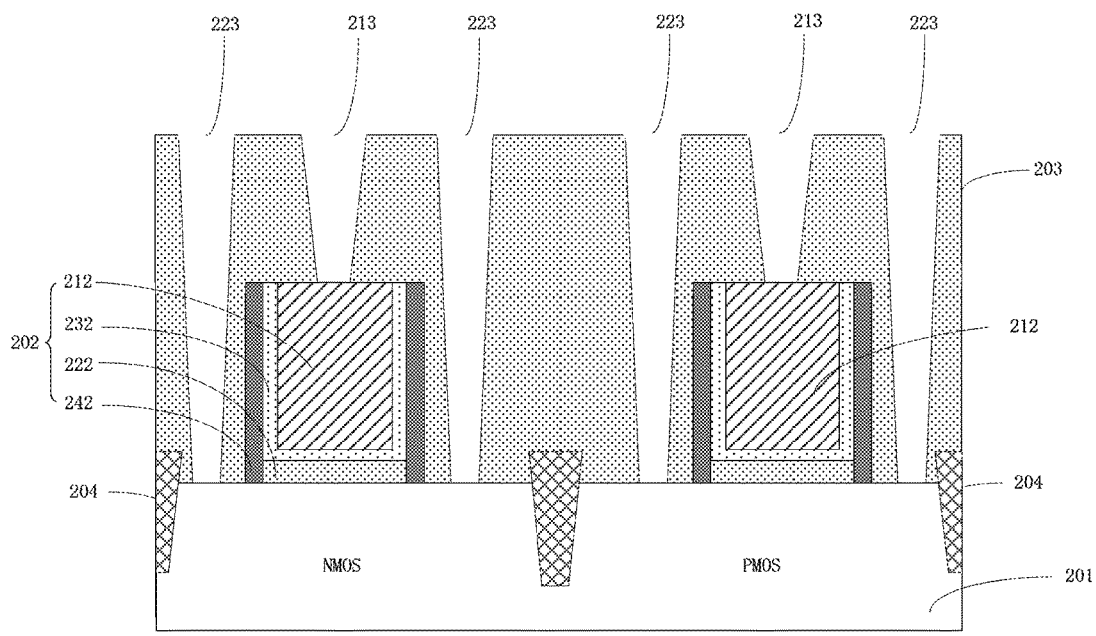
FIGS. 2A to 2C are cross-sectional views of intermediate stages in a manufacturing method of a semiconductor device according to one embodiment of the present disclosure.
Figure 2B:
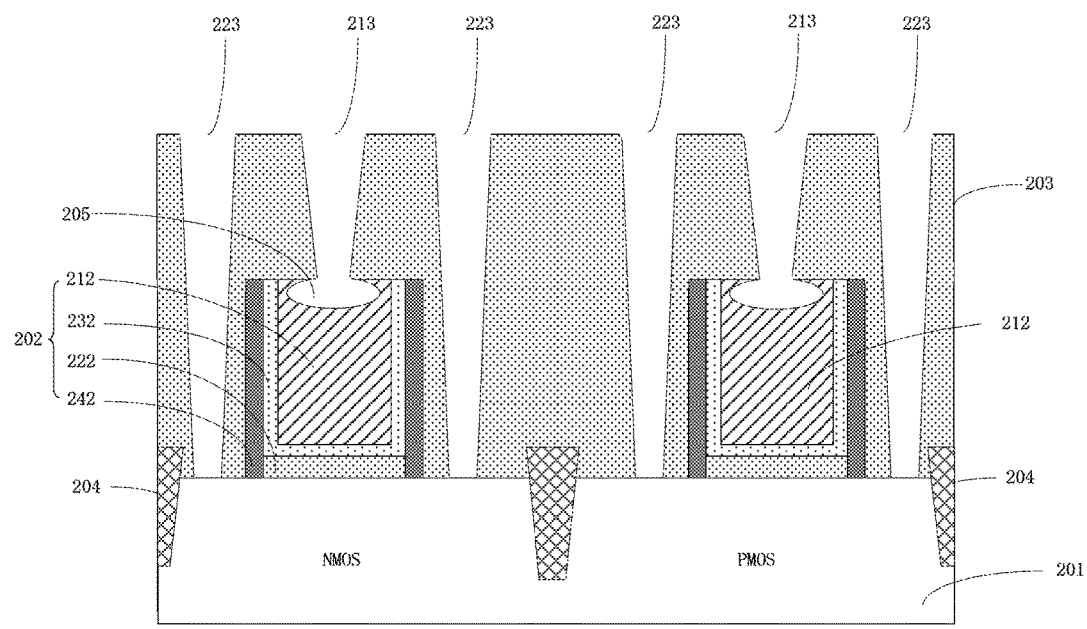
Figure 2C:
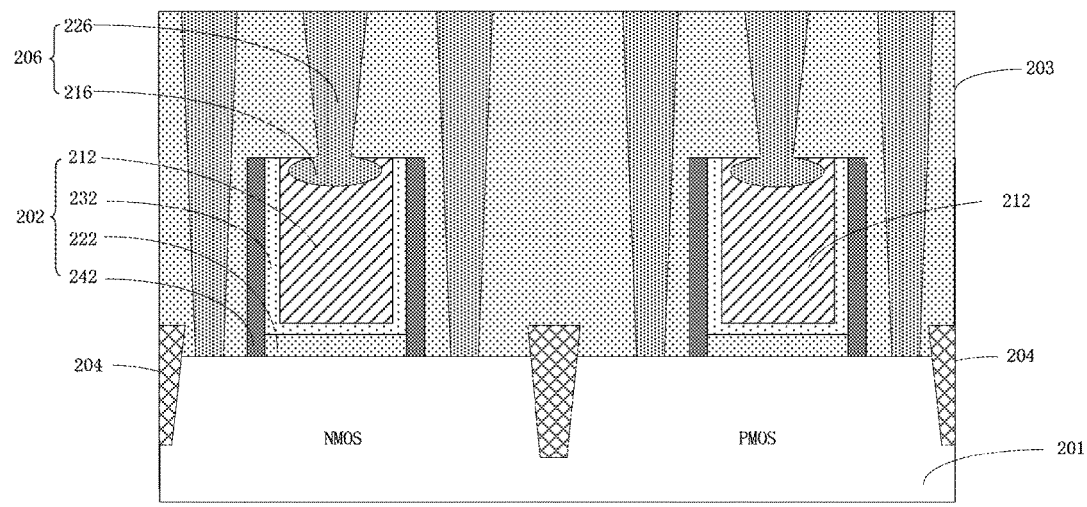

FIG. 1 is a simplified flowchart of a method for manufacturing a semiconductor device according to one embodiment of the present disclosure. FIGS. 2A to 2C are cross-sectional views of intermediate stages in a manufacturing method of a semiconductor device according to one embodiment of the present disclosure. The method for manufacturing a semiconductor device will be described below in detail with reference to FIG. 1 and FIG. 2A to 2C.

Referring to FIG. 1, at step 102, a substrate structure is provided.

FIG. 2A is a cross-sectional view of a substrate structure according to one embodiment of the present disclosure. Referring to FIG. 2A, the substrate structure includes a substrate 201, and a gate structure 202 on substrate 201. Gate structure 202 may include a metal gate 212. Illustratively, substrate 201 may be, e.g., an elemental semiconductor substrate such as a silicon substrate or a germanium substrate, or substrate 201 may be a compound semiconductor substrate such as a gallium arsenide substrate. Metal gate 212 may include a metal, e.g., aluminum.

In one embodiment, gate structure 202 may also include a gate dielectric layer (e.g., a high-k dielectric layer) 232 on the substrate, and metal gate 212 is formed on gate dielectric layer 232. In one embodiment, gate structure 202 may also include an interface layer 222 on substrate 201, gate dielectric layer 232 on interface layer 222, and metal gate 212 on gate dielectric layer 232. Interface layer 222 improves the interface performance between gate dielectric layer 232 and substrate 201, thereby enhancing the bonding force between the gate dielectric layer and the substrate. In addition, gate structure 202 may also include a spacer layer 242 on sidewalls of interface layer 222 and gate dielectric layer 232.

It is to be noted that gate structure 202 may be implemented utilizing different processes, and the present disclosure is not limited to the example embodiment described above.

Referring still to FIG. 2A, the substrate structure may include an interlayer dielectric layer 203 on gate structure 202 and having a first contact hole 213 exposing a surface portion of metal gate 212. Further, a source region and a drain region may be disposed on opposite sides of gate structure 202, and the source region and the drain region each may have a contact, i.e., a metal silicide such as NiSi formed on an upper surface of the source region and the drain region. Interlayer dielectric layer 203 may also include contact holes 223 exposing upper surfaces of the source region and the drain region.

Herein, the substrate structure may include an isolation structure 204 that separates an NMOS region and a PMOS region. The NMOS region and the PMOS region each may include gate structure 202 and first contact hole 213.

In one embodiment, the substrate structure may be formed using the following processes: first, an interlayer dielectric layer 203 is formed on metal gate 212, an amorphous carbon layer, e.g., an Advanced Patterning Film (APF), a dielectric anti-reflective coating (DARC), a bottom anti-reflective coating (BARC), and a patterned photoresist are sequentially formed on interlayer dielectric layer 203. Then, the BARC, the DARC, the APF, and the interlayer dielectric layer are sequentially etched using the patterned photoresist as a mask to form a first contact hole 213 extending to the metal gate. Herein, when first contact hole 213 is formed, a portion of metal gate may be down-etched (removed). In addition, contact holes 223 can also be formed at the time (simultaneously) extending into the source region and the drain region.

Referring back to FIG. 1, at step 104, a wet etching process is performed to remove a portion of metal gate 212 to form a second contact hole 205, as shown in FIG. 2B. Herein, first contact hole 213 and second contact hole 205 are in communication with each other and form together a contact member. Second contact hole 205 has a size that is larger than a size of first contact hole 213. It is to be understood that the size of first contact hole and the size of second contact hole are referred to as a size in a cross-sectional view in the direction parallel to the surface of substrate 201.

In one embodiment, a remaining portion of metal gate 212 may have a periphery surrounding second contact hole 205. That is, an upper portion of metal gate 212 is partially removed (etched away) in the direction along the surface of substrate 201. In another embodiment, the remaining portion of metal gate 212 is below second contact hole 205, i.e., the upper portion of metal gate 212 is entirely removed in the direction along the surface of substrate 201.

In one embodiment, the wet etching process utilizes an etchant that may include an oxidizing agent, a concentrated sulfuric acid, water, a buffer agent and a cleaning solution. The oxidizing agent may include $H_2O_2$, $HNO_2$, $HNO_3$, or $O_3$. The buffer agent may include $CH_3COOH$. The cleaning solution may include a hydrochloric acid or a diluted hydrofluoric acid (DHF). The oxidizing agent may oxidize metal gate 212 to form, e.g., $Al_2O_3$, and the cleaning solution will etch the oxidized metal gate. The buffer agent facilitates a more uniform wet etching for a more pronounced isotropic etching.

In one embodiment, the mass ratio of the oxidizing agent and the concentrated sulfuric acid to water and the buffer agent may be in the range (1-6):(30-100):(8-20), e.g., (2, 4, or 5):(40:50, or 70):(10, 15, or 18). In the case of the above-mentioned ratio, the formed contact hole has a more uniform size. In a specific embodiment, the mass ratio of the oxidizing agent to the concentrated sulfuric acid is in the range between 1:1 and 1:6, e.g., 1:2, 1:3, 1:5, etc., so that formed first contact hole 213 has an even more uniform size.

In one embodiment, the diluted hydrofluoric acid may have a concentration in the range between 50 ppm and 200 ppm, e.g., 80 ppm, 100 ppm, 150 ppm etc. In one embodiment, the wet etching process is performed for a time duration in the range between 20 seconds and 120 seconds, e.g., 50 s, 80 s, 100 s, etc.

In the embodiment, after forming first contact hole 213, a wet etching process is performed. When performing the wet etching, etchant will enter through first contact hole 213 to perform an isotropic etching on metal gate 212, i.e., metal gate 212 is etched in the longitudinal and transverse directions so that formed second contact hole 205 has a size that is larger than the size of first contact hole 213 to enlarge the contact surface area between a contact member formed in a subsequent filling of the second contact hole with a metal material and metal gate 212, thereby reducing the contact resistance between the contact member and the metal gate. In addition, for metal gate 212 of different devices, the size of second contact hole 205 by wet etching is also more convergent, i.e., the difference in sizes between different second contact holes 205 of different devices is smaller, thereby reducing the variations in the contact resistance between the contact member formed in a subsequent filling of the second contact hole with a metal material and metal gate 212.

Referring back to FIG. 1, in step 106, a metal material (e.g., tungsten) is formed in first contact hole 213 and second contact hole 205 to form a contact member 206, as shown in FIG. 2C. Herein, contact member 206 includes a first region 216 and a second region 226. Second region 226 has a size that is smaller than a size of first region 216. As used herein, the size is referred to a cross-sectional size viewed in the direction parallel to the surface of the substrate. First region 216 is disposed on at least a remaining portion of metal gate 212 and second region 226 is disposed on a portion of first region 216.

Embodiments of the present disclosure also provide a semiconductor device.

Referring to FIG. 2C, the semiconductor device may include a substrate 201 and a gate structure 202 on substrate 201. Gate structure 202 includes a metal gate 212. The semiconductor device may also include a contact member 206 that extends to metal gate 212. Contact member 206 includes a first region 216 disposed on at least a portion of metal gate 212 and a second region 226 disposed on a portion of first region 216.

In the embodiment, first region 216 may be disposed on a portion of the surface of metal gate or on the entire surface of metal gate 212 depending on the shape formed by second contact hole 205. In one embodiment, the metal gate may have an upper portion surrounding the first region, so that the first region of the contact member may be partially below the upper portion of the metal gate. In another embodiment, the metal gate is below the first region of the contact member, i.e., the upper surface of the metal gate is entirely covered by the first region of the contact member.

One of skill in the art will appreciate that the above-described method of the present disclosure is suitable for both a PMOS device and an NMOS device. The processes of manufacturing gate structure 202 of a PMOS device and an NMOS device may differ.

Figure 3:
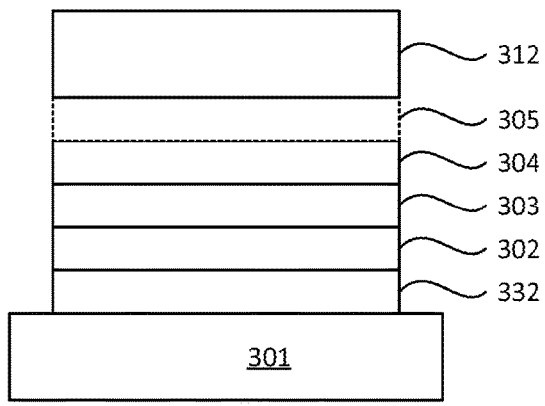
FIG. 3 is a cross-sectional view of a gate structure for a PMOS device according to one embodiment of the present disclosure.

A specific embodiment of a gate structure for a PMOS device will be described in detail below. FIG. 3 is a cross-sectional view of a gate structure for a PMOS device according to one embodiment of the present disclosure. Referring to FIG. 3, the gate structure may include a gate dielectric layer 332 on a substrate 301, a first barrier layer 302 on the gate dielectric layer, a P-type work function adjustment (e.g., TiN) layer 303 on the first barrier layer, a second barrier layer 304 on the P-type work function adjustment layer, and a metal gate 312 on the second barrier layer. In one embodiment, the first barrier layer may include a TiN layer on the gate dielectric layer and a TaN layer on the TiN layer. The second barrier layer may include a TiN layer on the P-type work function adjustment layer and a TaN layer on the TiN layer. In one embodiment, gate structure 202 may also include an adhesive layer (e.g., TiAl) 305 between the second barrier layer and the metal gate.

In the gate structure for the PMOS device, the first barrier layer prevents metal elements of the P-type work function adjustment layer from diffusing into the gate dielectric layer, and the second barrier layer prevents metal elements of the metal gate from diffusing into the P-type work function adjustment layer.

Figure 4:
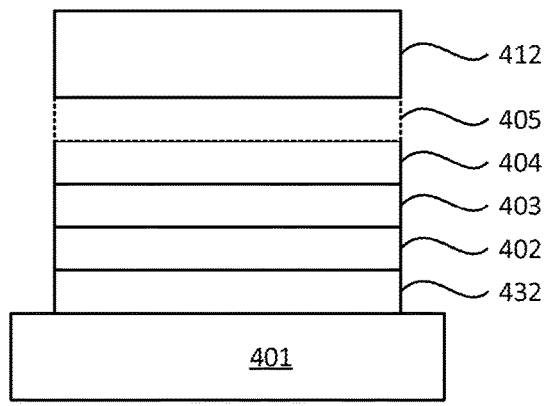
FIG. 4 is a cross-sectional view of a gate structure for an NMOS device according to one embodiment of the present disclosure.

A specific embodiment of a gate structure for an NMOS device will be described in detail below. FIG. 4 is a cross-sectional view of a gate structure for an NMOS device according to one embodiment of the present disclosure. Referring to FIG. 4, the gate structure may include a gate dielectric layer 432 on substrate 401, a first barrier layer 402 on the gate dielectric layer, an N-type work function adjustment (e.g., TiAl) layer 403 on the first barrier layer, a second barrier layer 404 on the N-type work function adjustment layer, and a metal gate 412 on the second barrier layer. In one embodiment, the first barrier layer may include a TiN layer on the gate dielectric layer and a TaN layer on the TiN layer. The second barrier layer may include a TiN layer. In one embodiment, the gate structure may also include an adhesive layer (e.g., TiAl) 405 disposed between the second barrier layer and the metal gate.

In the gate structure for the NMOS device, the first barrier layer prevents metal elements of the N-type work function adjustment layer from diffusing into the gate dielectric layer, and the second barrier layer prevents metal elements of the metal gate from diffusing into the N-type work function adjustment layer.

Figure 5:
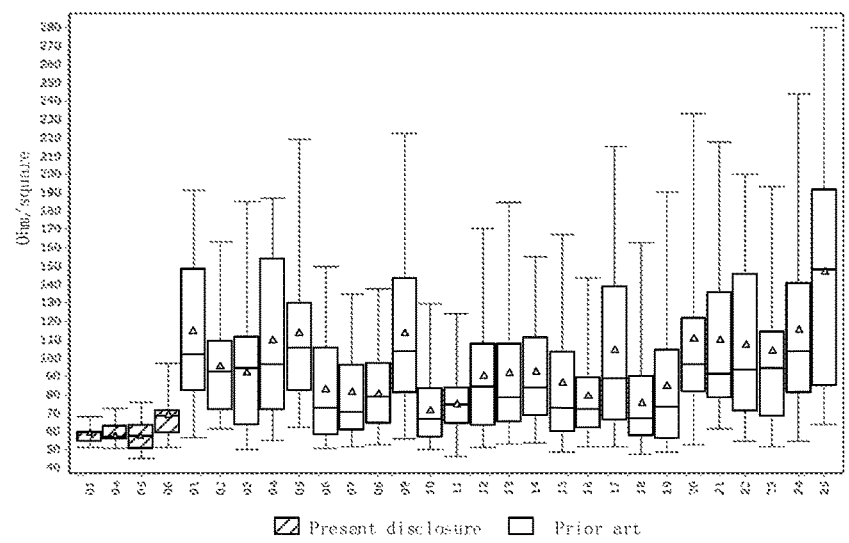
FIG. 5 is a graph illustrating contact resistance values between a contact member and a metal gate of different devices of the prior art and according to the present disclosure across multiple wafer lots.

FIG. 5 is a graph illustrating different values of the contact resistance between a contact member and the metal gate of different devices. The x-axis represents lot wafer IDs and the y-axis represents measured contact resistance values. As can be seen in FIG. 5, the contact resistance between the contact member and the metal gate of different devices of the prior art in different wafer lots varies over a large range. In contrast, the variation of the contact resistance between the contact member and the metal gate of different devices of the present disclosure in different wafer lots is significantly smaller and converges.

In summary, a method for manufacturing a semiconductor device and a semiconductor device have been described in detail. In order to avoid obscuring the teachings of the present disclosure, details known in the art will not be described. For example, the first contact hole can be formed by any known dry etching techniques. The present disclosure provides a novel semiconductor device and a method for manufacturing a semiconductor device having a significantly lower contact resistance between a contact member and a metal gate. While various aspects and embodiments have been described herein, other aspects and embodiments will be apparent to those skilled in the art.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
a substrate;
a gate structure having a metal gate on the substrate; and
a contact member extending into the metal gate, the contact member including a first region on the metal gate and a second region on the first region, the first region having a cross-sectional size larger than a cross-sectional size of the second region,
wherein the gate structure comprises:
a gate dielectric layer on the substrate;
a first barrier layer on the gate dielectric layer;
a P-type work function layer on the first barrier layer;
a second barrier layer on the P-type work function layer; and
the metal gate on the second barrier layer.

2. The semiconductor device of claim 1, wherein the second barrier layer comprises:
a TiN layer on the P-type work function layer; and
a TaN layer on the TiN layer.

3. A semiconductor device, comprising:
a substrate;
a gate structure having a metal gate on the substrate; and
a contact member extending into the metal gate, the contact member including a first region on the metal gate and a second region on the first region, the first region having a cross-sectional size larger than a cross-sectional size of the second region, wherein the gate structure comprises:
a gate dielectric layer on the substrate;
a first barrier layer on the gate dielectric layer;
an N-type work function layer on the first barrier layer;

a second barrier layer on the N-type work function layer; and the metal gate on the second barrier layer.

4. The semiconductor device of claim 3, further comprising:

an adhesive layer between the second barrier layer and the metal gate.

5. The semiconductor device of claim 4, wherein the adhesive layer comprises TiAl.

6. The semiconductor device of claim 3, wherein the first barrier layer comprises:

a TiN layer on the gate dielectric layer; and a TaN layer on the TiN layer.

7. The semiconductor device of claim 3, wherein the second barrier layer comprises a TiN layer.

8. The semiconductor device of claim 1, further comprising:

an adhesive layer between the second barrier layer and the metal gate.

9. The semiconductor device of claim 8, wherein the adhesive layer comprises TiAl.

10. The semiconductor device of claim 1, wherein the first barrier layer comprises:

a TiN layer on the gate dielectric layer; and a TaN layer on the TiN layer.

11. The semiconductor device of claim 1, wherein the second barrier layer comprises a TiN layer.

12. A semiconductor device, comprising:

a substrate;

a first gate structure having a first metal gate on the substrate;

a first contact member extending into the first metal gate, the first contact member including a first region on the first metal gate and a second region on the first region, the first region having a cross-sectional size larger than a cross-sectional size of the second region;

a second gate structure having a second metal gate on the substrate;

a second contact member extending into the second metal gate, the second contact member including a third region on the second metal gate and a fourth region on the third region, the third region having a cross-sectional size larger than a cross-sectional size of the fourth region;

wherein the first gate structure comprises:

a first gate dielectric layer on the substrate;

a first barrier layer on the first gate dielectric layer;

a P-type work function layer on the first barrier layer;

a second barrier layer on the P-type work function layer; and the first metal gate on the second barrier layer, wherein the second gate structure comprises:

a second gate dielectric layer on the substrate;

a third barrier layer on the second gate dielectric layer;

an N-type work function layer on the third barrier layer;

a fourth barrier layer on the N-type work function layer; and the second metal gate on the second barrier layer.

* * * * *